United States Patent
Dirks

(10) Patent No.: US 7,825,526 B2
(45) Date of Patent: Nov. 2, 2010

(54) FINE-PITCH ROUTING IN A LEAD FRAME BASED SYSTEM-IN-PACKAGE (SIP) DEVICE

(75) Inventor: Peter Adrianus Jacobus Dirks, Nijmegen (NL)

(73) Assignee: NXP B.V., Eindhoven (NL)

( * ) Notice: Subject to any disclaimer, the term of this patent is extended or adjusted under 35 U.S.C. 154(b) by 323 days.

(21) Appl. No.: 12/088,713

(22) PCT Filed: Sep. 28, 2006

(86) PCT No.: PCT/IB2006/053553

§ 371 (c)(1),
(2), (4) Date: Jun. 24, 2008

(87) PCT Pub. No.: WO2007/036911

PCT Pub. Date: Apr. 5, 2007

(65) Prior Publication Data

US 2010/0006992 A1     Jan. 14, 2010

Related U.S. Application Data

(60) Provisional application No. 60/723,161, filed on Sep. 30, 2005.

(51) Int. Cl.
*H01L 23/48* (2006.01)
*H01L 23/52* (2006.01)
*H01L 29/40* (2006.01)

(52) U.S. Cl. .................... 257/786; 257/697; 257/724

(58) Field of Classification Search ............ 257/786, 257/784, 698, 686, 723, 724, 693, 697
See application file for complete search history.

(56) References Cited

U.S. PATENT DOCUMENTS

| 5,255,839 | A | | 10/1993 | da Costa et al. | |
| 5,468,999 | A | | 11/1995 | Lin et al. | |
| 5,481,436 | A | * | 1/1996 | Werther | 361/784 |
| 5,604,379 | A | | 2/1997 | Mori | |
| 5,789,816 | A | * | 8/1998 | Wu | 257/723 |
| 6,137,168 | A | * | 10/2000 | Kirkman | 257/691 |
| 6,351,025 | B1 | | 2/2002 | Ohsawa et al. | |
| 6,441,501 | B1 | * | 8/2002 | Tseng et al. | 257/784 |

(Continued)

FOREIGN PATENT DOCUMENTS

EP    1460690 A1    9/2004

(Continued)

*Primary Examiner*—S. V Clark
(74) *Attorney, Agent, or Firm*—Peter Zawilski

(57) ABSTRACT

In an example embodiment, there is a package substrate (200) for mounting an integrated circuit (IC) device (205). The package substrate comprises an IC device placement area (290) surrounded by pad landings (215). For placing surface mount devices in vicinity of the pad landings, there is a plurality of component pads (235a, 235b, 235c, 235d). The plurality of component pads surrounds the pad landings (215). A plurality of device pins (225a, 225b, 225c, 225d, 245a, 245b, 245c, 245d) surrounds the component pads. One or more of the plurality of device pins, having fine-pitch conductive paths (270), couple the one or more of the plurality of device pins to a set of corresponding pad landings (215) or to a set of corresponding component pads; the fine-pitch conductive paths (270) traverse regions between the plurality of component pads.

17 Claims, 3 Drawing Sheets

U.S. PATENT DOCUMENTS

| | | |
|---|---|---|
| 6,674,156 B1 | 1/2004 | Bayan et al. |
| 6,921,981 B2 * | 7/2005 | Tien ........................... 257/786 |
| 6,979,905 B2 * | 12/2005 | Nishida et al. .............. 257/777 |
| 7,176,582 B2 | 2/2007 | Kloen et al. |
| 7,247,938 B2 | 7/2007 | Groenhuis et al. |
| 2003/0098498 A1 | 5/2003 | Dobritz et al. |
| 2005/0046033 A1 | 3/2005 | Chung et al. |

FOREIGN PATENT DOCUMENTS

| | | |
|---|---|---|
| WO | 2003085728 A1 | 10/2003 |
| WO | 2003085731 A1 | 10/2003 |

* cited by examiner

FINE-PITCH ROUTING IN A LEAD FRAME BASED SYSTEM-IN-PACKAGE (SIP) DEVICE

The invention relates to integrated circuit (IC) packaging. More particularly this invention relates to routing of lines in the substrate of a high performance lead frame based package to accommodate additional components, such as those found in system-in-package devices.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

The packaging of complex IC devices is increasingly playing a role in its ultimate performance. Within the IC devices multiple components in addition to the integrated circuit die, are often needed to perform the desired functions demanded by a user. The packaging must be suitable for the demands of modern technology. For example, RF devices often require surface mount devices (SMD), such as chip capacitors to decouple the RF from other parts of the circuit. In bus devices, simultaneous switching of outputs (SSO) often necessitates sufficient capacitance at close enough proximity to power supply rails to minimize SSO noise. In power management devices, often SMDs are required.

One example package that is suitable for high performance devices, may be found in International Application published under the Patent Cooperation Treaty (PCT) titled, "Semiconductor Device and Method of Manufacturing Same," of Kloen et al. (International Publication Number, WO 03/085731, Publication Date: 16 Oct. 2003) and in U.S. patent application Ser. No. 10/510,591 filed on Oct. 8, 2004 titled, "Semiconductor Device and Method of Manufacturing Same," of the same inventors. This package is a known as a thin universal leadless industrial package (i.e., TULIP). Another example package may be found in International Application published under the PCT titled, "Carrier, Method of Manufacturing a Carrier and an Electronic Device," of Groenhuis et al. (International Publication Number, WO 03/085728, Publication Date: 16 Oct. 2003) and in U.S. patent application Ser. No. 10/510,588 filed on Oct. 8, 2004 titled, "Carrier, Method of Manufacturing a Carrier and an Electronic Device," of the same inventors. These references are incorporated by reference in their entirety. Packages encompassing this platform include, but are not limited to, QFN (Quad Flat-pack No-leads), DQFN (Depopulated very-thin Quad Flat-pack No-leads), HVQFN (Heatsink Very-thin Quad Flat-pack No-leads), SSON (Shrink Small Outline; No leads), and XSON (extremely thin Small Outline; No leads).

In an example product, SMDs are often soldered to landings on the printed circuit board (PCB) at some distance from the packaged IC. SMDs mounted outside the package consume valuable of board space and increase board cost. Also the distance between the active chip and the SMD may reduce the product's performance. Especially in RF it can be challenging to select the proper location of the external SMD. Such a challenge in design of the IC may increase loss of time to market. An SMD may include, but is not limited to, SIP (system-in-package) or MCM (silicon chips in multi-chip-module package), discrete components such as resistors, capacitors, and inductors.

In another example product, SMDs may be placed inside the package in a location where there are no bond wires. Valuable space is used up.

Refer to FIG. 1. In an example prior art package, a substrate 100 has a device die 110 bonded thereto. SMDs 120 are attached at pads 130. An outer ring of pad landings 140 surrounds an inner ring of pad landings 145. Bond wires 160, 165 couple pad landings 140, 145 to bond pads (not illustrated) on the device die 110. SMDs have been located away from the bond wires 160, 165 and no bond wires cross over an SMD.

Furthermore, having SMDs inside the package and under the bond wires is very difficult or not possible, in that the SMD may disturb the flow of mold compound during the molding process causing additional wire sweep and short-circuiting between the bond wires. Under some example design rules, it is not possible to route under the SMD owing to the current possible routing pitch with lead frames (e.g., 0.4 mm, a 0.2 mm width and 0.2 mm spacing) is too coarse.

There is exists a need for a routing scheme that enables the installation of supplemental components in an IC package that enhances a product's performance and efficiently utilizes the package's capacity, and effectively reduces production costs.

This invention has been found useful in facilitating the installation of supplemental components in an IC package in close proximity to an IC device die. The use of fine-pitch routing of connection lines to route underneath the supplemental components allows for shorter bond wires between the IC device die and the package. Bond wires do not cross over the supplemental components. Furthermore, the supplemental devices are placed within the boundaries of the device substrate. During encapsulation the IC device die and supplemental components gain are both sealed and protected from the operating environment. Furthermore, the flow of encapsulating material is not disturbed by the supplemental components that may result in additional wire sweep causing short circuits between bond wires.

In an example embodiment according to the present invention, there is a package substrate for mounting an integrated circuit (IC) device. The package substrate comprises an IC device placement area surrounded by pad landings. For placing surface mount devices in vicinity of the pad landings, there is a plurality of component pads. The plurality of component pads surrounds the pad landings. A plurality of device pins surrounds the component pads. One or more of the plurality of device pins, having fine-pitch conductive paths, couple the one or more of the plurality of device pins to a set of corresponding pad landings or to a set of corresponding component pads; the fine-pitch conductive paths traverse regions between the plurality of component pads.

In another example embodiment, there is a semiconductor device that comprises an underside layer having openings. A carrier has a first side opposite a second side, wherein the first side includes a conductive layer having a predetermined pattern that defines a number of mutually isolated connection conductors, and wherein the second side is in contact with the underside layer and includes contact surfaces corresponding to the connection conductors for placement over a substrate, wherein the openings in the underside layer permit access to the connection conductors. The carrier includes a cavity defined between the first and second sides, the cavity having a die pad region, the carrier further including component pad regions. The component pad regions provide for the placement of surface mount devices on the carrier and the component pad regions are coupled to selected connection conductors with fine-pitch conductive paths. An integrated circuit (IC) device includes a die area located in the cavity and is attached to the die pad region of the underside layer. The IC further includes bonding pads that are wire bonded to the connection conductors. A passivating envelope encapsulates the IC device and extends as far as the carrier. The passivating envelope is mechanically anchored into side faces in the connection conductors.

In yet another example embodiment, there is a semiconductor device. The semiconductor device comprises an underside layer having openings. There is a carrier having a first side opposite a second side. The first side includes a conductive layer, the conductive layer having a predetermined pattern that defines a number of mutually isolated connection conductors. The conductive layer has a first conductive layer, a second conductive layer and a third conductive layer; the second conductive layer comprises a material that can be etched in an etchant that leaves the first conductive layer and the third conductive layer substantially intact and the etchant defines recesses in side faces of the connection conductors. The conductive layer further includes a predetermined pattern that defines a number of mutually isolated connection conductors; the second side is in contact with the underside layer and includes contact surfaces corresponding to the connection conductors for placement over a substrate; the openings in the underside layer permit access to the connection conductors. The carrier includes a cavity defined between the first and second sides; the cavity has a die pad region; the carrier further includes component pad regions. The component pad regions provide for the placement of surface mount devices on the carrier; the component pad regions are coupled to selected connection conductors with fine-pitch conductive paths, the fine pitch conductive paths being defined in either the first conductive layer or the third conductive layer. An integrated circuit (IC) device including a die area is located in the cavity and is attached to the die pad region of the underside layer, and further includes bonding pads that are wire bonded to the connection conductors. There is a passivating envelope that encapsulates the IC device and extends as far as the carrier, wherein the passivating envelope is mechanically anchored into the recesses in the side faces of the connection conductors; the recesses provide attachment to the passivating envelope.

The above summary of the present invention is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1:
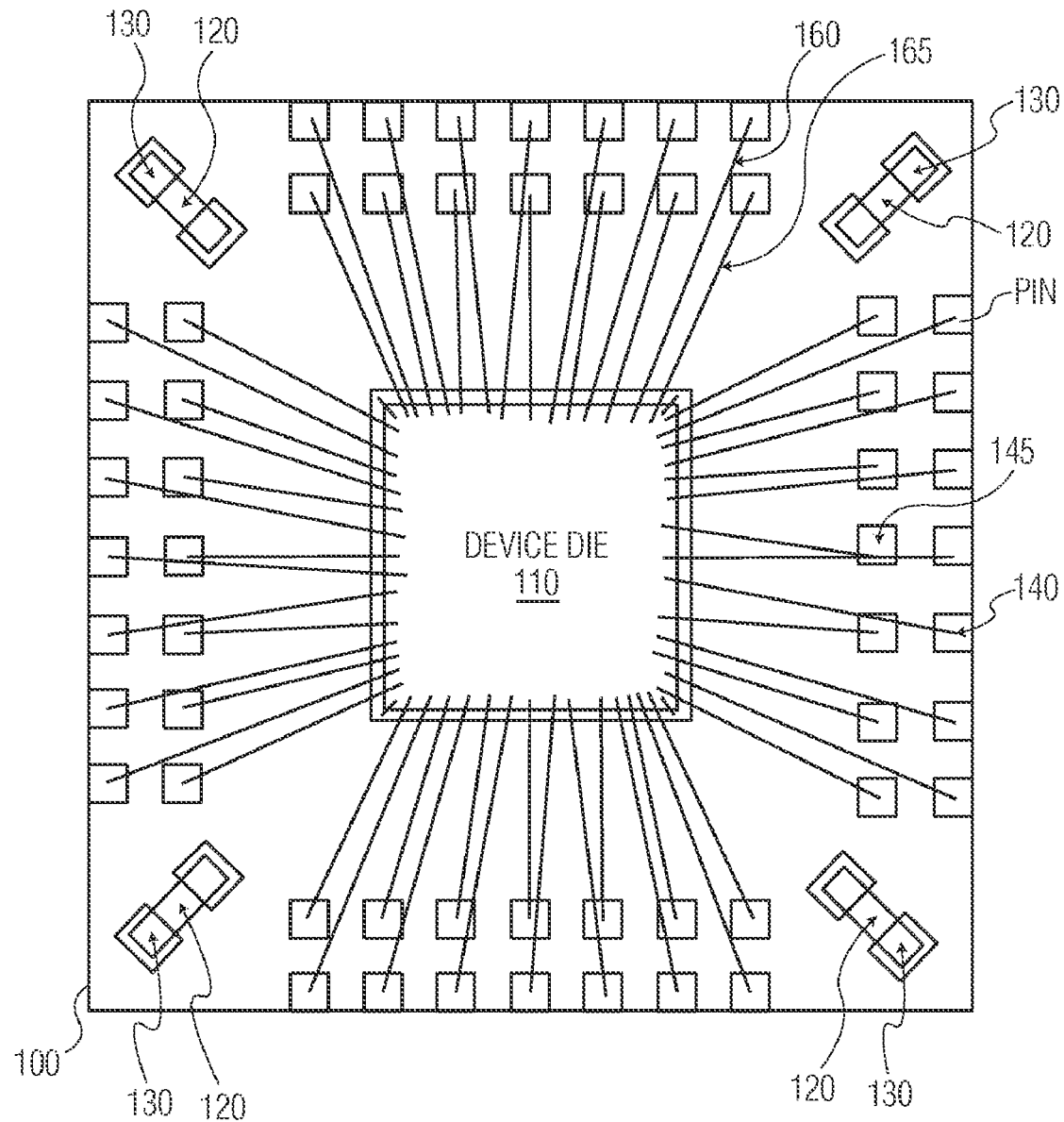
FIG. 1 (Prior Art) is a coarse pitch substrate depicting the bonding of an example product die and the placement of surface mount devices (SMDs) away from the bond wires.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful in more efficiently using space within a high-performance package. The fine pitch routing of wires from SMD devices to the pad landings in the package substrate, which in turn are wire bonded to an IC devices bond pads significantly reduce the length of wire bonds. The shorter wire bonds are more easily manufactured. Furthermore, the parasitic inductance and resistance associated with longer wire bonds is minimized. In addition, the routing of connections from the SMDs on a product's printed circuit board is reduced. These reductions in wiring become increasingly significant in the area of RF and mixed-signal applications. For example, products in wireless communications benefit from minimized die sizes and the close placement of supplement components (e.g., SMDs, MCMs, etc.).

In an example embodiment according to the present invention, a HVQFN package has fine pitch routing used to connect SMDs to the IC device. Although a particular package is described, one skilled in the art may realize that other package types may be designed and used. The packages that may use the present invention are those using a lead frame. These may include, but are not limited to, leadless chip carriers (LCC), thin universal leadless industrial package (TULIP), and Thin Array Plastic Package (TAPP), etc. In power management devices, for example, an exposed metal die pad is necessary for an electrical ground and its low thermal resistance. For RF devices the exposed metal die pad forms an electrical ground plane.

Figure 2:
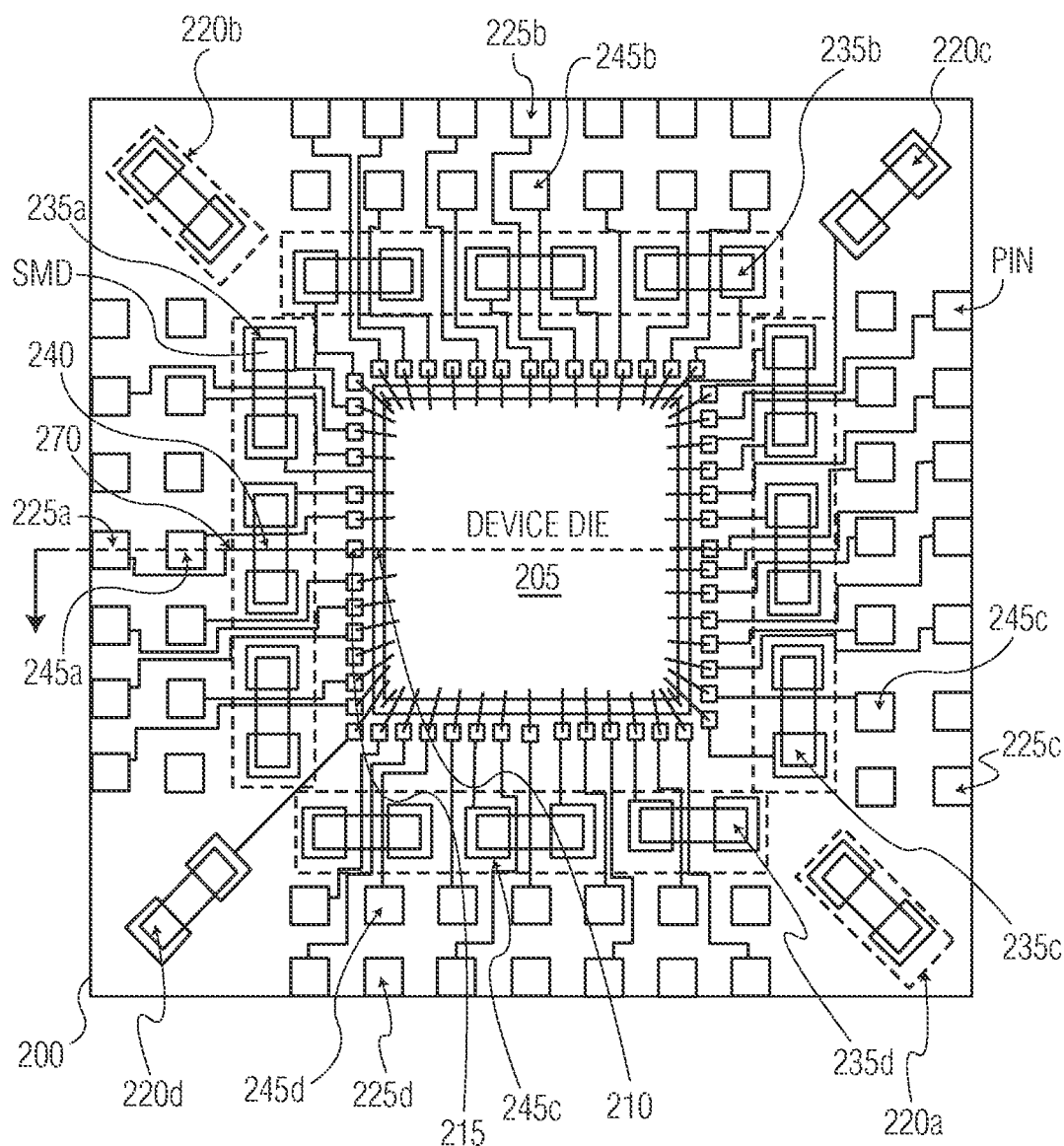
FIG. 2 is an example embodiment of a QFN lead frame package designed with fine-pitch routing in accordance with the present invention.

Refer to FIG. 2. A multi-row QFN substrate 200 has a device die 205 placed thereon. The QFN substrate may employ TULIP technology. Such a substrate may have more than one conductive layer sandwiched between insulating layers. Multiple layers provide more options in the routing design of the substrate. Bond wires 210 couple the device die 205 to the substrate through pad landings 215. An outer row of device pins surrounds and inner row of device pins. For example, pins 225a, 225b, 225c, and 225d are outer row device pins and pins 245a, 245b, 245c, and 245d are inner row of device pins. As indicated by dashed lines, these inner row pins surround component pads to accommodate surface mounted devices (SMDs) 235a, 235b, 235c, and 235d. SMDs 220a, 220b, 220c, and 220d are placed in corners of the substrate. Two of the SMDs, 220c and 220d have fine pitch routing coupling them to pad landings 215. Underneath a number of SMDs, fine-pitch routing from inner row device pins and outer row device pins serve to connect these pins to pad landings 215. For example, outer pin 225a and inner pin 225b have fine-pitch routing 270 connecting these respective pads to pad landings in the vicinity of the device die 205. The fine pitch routing is less than 0.4 mm (i.e, 0.2 mm line width and 0.2 mm distance between lines) and overcomes the too coarse routing pitch of some lead frames. In one example package, the fine-pitch routing is about 150 μm (i.e., a 75 μm line width and a 75 μm spacing). In other packages according to the present invention, the fine pitch routing is about 100 μm (i.e., a 50 μm line width and a 50 μm spacing). In other packages, the fine pitch routing is about 80 um (40 um spacing and 40 um width), allowing 2 routing tracks (3× distance+ 2× width) in a length of 200 um. In an example package in use, the minimum distance between two soldering connections (for example pins in a dual row package) is about 200 um. With an 80 μm, it is possible to have 2 tracks between 2 pins.

In contrast to the prior art package of FIG. 1, bond wires 210 do not have to cross over SMDs and the bond wire lengths are shorter. Also, the SMDs may be placed closer to the device die unlike the SMDs 130 on pads 120 of the package of FIG. 1.

Figure 3:
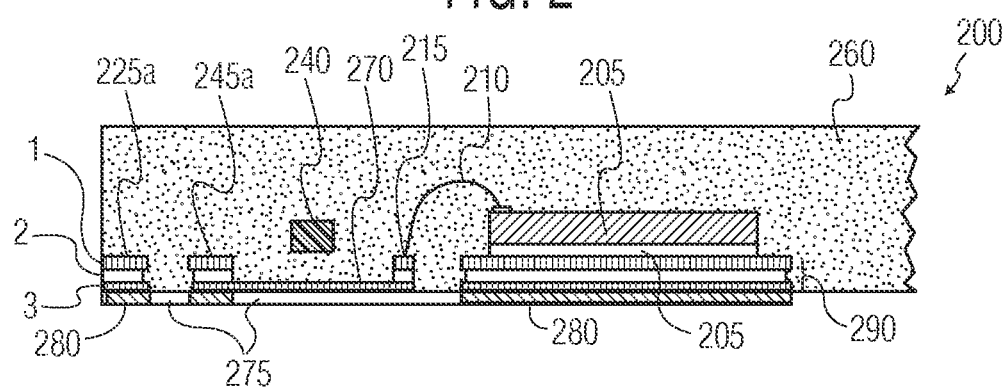
FIG. 3 is a side view of FIG. 2.

In another embodiment according to the present invention, the TULIP platform may be adapted to incorporate the fine pitch routing making it possible to place SMDs in the vicinity of the IC device die. Refer to FIG. 3. In a side view of FIG. 2, the TULIP platform may be used in accordance with the present invention. TULIP can have one layer (1 ply) or three layers (3-ply). In an example embodiment, three layers, the layers that are used include Cu (1), Ni (2) and Cu (3). The fine pitch routing layer 270 has to be a thin layer, otherwise the under etching in preparing the lead frame recesses, would etch away the small fine-pitch routing track. In the 3-ply TULIP, the lower Cu layer (3) may be used as the fine routing layer 270. The die 205 is attached with an adhesive 265 on die pad 290. The device is encapsulated in a molding compound 260. Recesses 295 defined in the Ni (2) layer provide anchoring for the molding compound 260. Thus there is no fine-pitch routing track directly under the SMD 240, as illustrated in FIG. 2. The Cu fine-pitch tracks are visible from the outside of the package. However, there is a risk of short circuits when such a device is mounted on a printed circuit board (PCB). Short circuits owing to solder 280 on the PCB can be prevented by having solder resist 275 applied directly to the fine pitch conductive routing tracks and to areas in which no solder should be applied.

In another example embodiment, the upper Cu layer (1) may be used as fine-pitch conductive paths (not illustrated). Generally, these fine-pitch conductive paths are routed under the SMDs 240 as they traverse the component pads. The selection of the Cu layer (1) or Cu layer (3) for defining the fine pitch conductive paths is governed by a package design's particular requirements.

Figure 4:
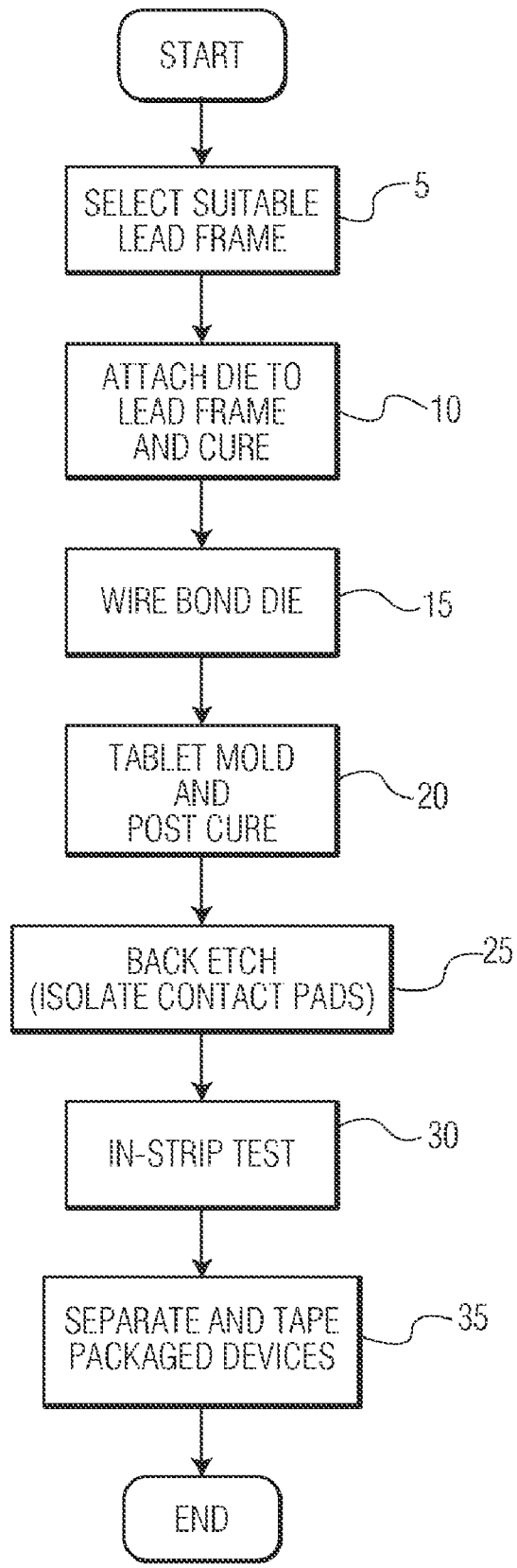
FIG. 4 is a flowchart of an example process in building an IC device in accordance with the present invention.

Refer to FIG. 4. In an example embodiment according to the present invention, an IC device may be packaged. A lead frame suitable for a given application is selected 5. The lead frame is designed with the appropriate component pads for the SMDs and routing of fine-pitch conductive paths is defined to couple the SMDs to selected connection conductors. Use of fine-pitch routing according to the present invention may be applied to a lead frame with or without use of TULIP technology. The IC die is attached to the die pad in the lead frame with an adhesive 10. The adhesive may be a glue or sticky tape (e.g., QFN tape applied as a die carrier). After attaching the die, the adhesive is cured. The die is then wire bonded 15. The bonded die and lead frame assembly is encapsulated in a passivating envelope. In a particular example process, the assembly is tablet molded and post cured 20. Tablet molding (or map molding) is applied in QFN-type packages to encapsulate in one step, all IC devices in a strip. The maps in the strip are encapsulated in the molding compound. Later, separate devices are sawn out of the map. During post-cure, the strip is baked in an oven at about 150° C. Often a weight is placed on the strip to enhance the curing of the mold compound and the flatness of the strip. The encapsulated IC device undergoes a back etch 25. The etch isolates the contact pads of the lead frame and exposes the underside of the IC die up to the die attach adhesive. The IC devices undergo electrical test 30 in an "in-strip test." The IC devices are separated and taped 35. Defective devices are discarded. The package IC device strip may be arranged, as in the aforementioned examples, in an array.

While the present invention has been described with reference to several particular example embodiments, those skilled in the art will recognize that many changes may be made thereto without departing from the spirit and scope of the present invention, which is set forth in the following claims.

What is claimed is:

1. A package substrate for mounting an integrated circuit device, the package substrate comprising:
   an IC device placement area surrounded by pad landings;
   a plurality of component pads for placing surface mount devices in vicinity of the pad landings, the plurality of component pads surrounding the pad landings;
   and a plurality of device pins surrounding the component pads, one or more of the plurality of device pins having fine-pitch conductive paths coupling the one or more of the plurality of device pins to a set of corresponding pad landings or to a set of corresponding component pads, the fine-pitch conductive paths traversing regions between the plurality of component pads; and
   wherein the fine pitch conductive paths are routed at less than about 80 μm in terms of cumulative line width and spacing.

2. A package substrate for mounting an integrated circuit device, the package substrate comprising:
   an IC device placement area surrounded by pad landings;
   a plurality of component pads for placing surface mount devices in vicinity of the pad landings, the plurality of component pads surrounding the pad landings;
   and a plurality of device pins surrounding the component pads, one or more of the plurality of device pins having fine-pitch conductive paths coupling the one or more of the plurality of device pins to a set of corresponding pad landings or to a set of corresponding component pads, the fine-pitch conductive paths traversing regions between the plurality of component pads; and
   wherein the fine pitch conductive paths are routed in the range of about 80 μm to about 150 μm in terms of cumulative line width and spacing.

3. A semiconductor device comprising:
   an underside layer having openings;
   a carrier having a first side opposite a second side, wherein the first side includes a conductive layer having a predetermined pattern that defines a number of mutually isolated connection conductors, and wherein the second side is in contact with the underside layer and includes contact surfaces corresponding to the connection conductors for placement over a substrate, wherein the openings in the underside layer permit access to the connection conductors;

the carrier including a cavity defined between the first and second sides, the cavity having a die pad region, the carrier further including component pad regions, the component pad regions providing for the placement of surface mount devices on the carrier, the component pad regions coupled to selected connection conductors with fine-pitch conductive paths;

an integrated circuit device including a die area located in the cavity and attached to the die pad region of the underside layer, and further including bonding pads that are wire bonded to the connection conductors;

and a passivating envelope that encapsulates the IC device and extends as far as the carrier, wherein the passivating envelope is mechanically anchored into side faces in the connection conductors.

4. The semiconductor device as recited in claim 3, wherein the side faces have recesses, the recesses providing attachment to the passivating envelope.

5. The semiconductor device as recited in claim 4, wherein the recesses are shaped concave or notched.

6. The semiconductor device as recited in claim 5, wherein the conductive layer includes a first conductive layer, a second conductive layer and a third conductive layer, the second conductive layer comprising a material that can be etched in an etchant that leaves the first conductive layer and the third conductive layer substantially intact and the etchant defines recesses in the side faces of the connection conductors.

7. The semiconductor device as recited in claim 6, wherein the fine-pitch conductive paths are defined in the first conductive layer.

8. The semiconductor device as recited in claim 5, wherein the fine-pitch conductive paths are defined in the third conductive layer.

9. The semiconductor device as recited in claim 8, wherein fine-pitch conductive paths are protected with a solder resist.

10. The semiconductor device as recited in claim 3, wherein the component pad regions surround the die pad region.

11. The semiconductor device as recited in claim 3, wherein the surface mount devices include at least one selected from the following: surface mount capacitors, surface mount resistors, surface mount inductors, integrated circuit chips, oscillators.

12. The semiconductor device as recited in claim 11, wherein the surface mount devices are two-terminal devices.

13. The package substrate as recited in claim 7, wherein the fine pitch conductive paths are routed at less than about 80 μm in terms of cumulative line width and spacing.

14. The package substrate as recited in claim 7, wherein the fine pitch conductive paths are routed in the range of about 80 μm to about 150 μm in terms of cumulative line width and spacing.

15. A semiconductor device comprising:

an underside layer having openings;

a carrier having a first side opposite a second side, wherein the first side includes a conductive layer, the conductive layer including a predetermined pattern that defines a number of mutually isolated connection conductors, the conductive layer having a first conductive layer, a second conductive layer and a third conductive layer, the second conductive layer comprising a material that can be etched in an etchant that leaves the first conductive layer and the third conductive layer substantially intact and the etchant defines recesses in side faces of the connection conductors;

the second side is in contact with the underside layer and includes contact surfaces corresponding to the connection conductors for placement over a substrate, wherein the openings in the underside layer permit access to the connection conductors;

the carrier including a cavity defined between the first and second sides, the cavity having a die pad region, the carrier further including component pad regions, the component pad regions providing for the placement of surface mount devices on the carrier, the component pad regions coupled to selected connection conductors with fine-pitch conductive paths, the fine pitch conductive paths being defined in either the first conductive layer or the third conductive layer;

an integrated circuit device including a die area located in the cavity and attached to the die pad region of the underside layer, and further including bonding pads that are wire bonded to the connection conductors;

and a passivating envelope that encapsulates the IC device and extends as far as the carrier, wherein the passivating envelope is mechanically anchored into the recesses in the side faces of the connection conductors, wherein the recesses provide attachment to the passivating envelope.

16. The semiconductor device as recited in claim 15, wherein a solder resist is applied to the underside layers in regions not having connection conductors.

17. The semiconductor device as recited in claim 16, wherein the solder resist is applied to the fine pitch conductive paths defined in the third conductive layer, the solder resist, the solder resist sealing the fine pitch conductive paths, as the semiconductor device is soldered to a printed circuit board.

* * * * *